United States Patent [19]

Deighton et al.

[11] Patent Number: 4,573,779

[45] Date of Patent: Mar. 4, 1986

[54] VARIABLE SIZE CIRCULAR APERTURE CAMERA

[75] Inventors: Guy A. Deighton, Delray Beach, Fla.; Gerry W. Moore, Leander, Tex.

[73] Assignee: International Business Machines Corporation, Armonk, N.Y.

[21] Appl. No.: 567,298

[22] Filed: Dec. 30, 1983

[51] Int. Cl.[4] ............................................. G03B 41/00
[52] U.S. Cl. ............................................ 354/4; 362/35
[58] Field of Search ................... 354/4, 5, 15; 355/46, 355/53, 54; 350/271, 274, 272, 266; 346/29, 78; 362/16–18, 35

[56] References Cited

U.S. PATENT DOCUMENTS

| | | | |
|---|---|---|---|
| 3,076,377 | 2/1963 | Brownscombe | 362/35 |
| 3,566,763 | 3/1971 | Knopf | 354/4 |
| 3,668,990 | 6/1972 | Hayes | 354/4 |
| 3,688,655 | 9/1972 | Klosterman et al. | 354/4 |
| 3,695,154 | 10/1972 | Webster | 354/4 |

OTHER PUBLICATIONS

*IBM Technical Disclosure Bulletin*, vol. 13, No. 7, Dec. 1970, p. 1760, "Printed Circuit Generation Camera", L. P. Hayes.

*IBM Technical Disclosure Bulletin*, vol. 10, No. 7, Dec. 1967, p. 984, "Halftone Master Land Generation", R. S. Ladd.

*Primary Examiner*—L. T. Hix
*Assistant Examiner*—Della Rutledge
*Attorney, Agent, or Firm*—Andrea P. Bryant

[57] ABSTRACT

Apparatus is disclosed for exposing circular patterns of light on a photosensitive surface by providing, spaced from the surface, a lengthwise variable light source focusable on the photosensitive surface and rotatable relative to the surface about an axis of rotation passing through the center of the photosensitive surface and the light source. In a modification, the axis of rotation passes through the center of the photosensitive surface and through a point radially offset from the light source.

10 Claims, 3 Drawing Figures

VARIABLE SIZE CIRCULAR APERTURE CAMERA

TECHNICAL FIELD

The present invention relates to artwork generation apparatus for use in the manufacture of printed circuit boards. More particularly, it relates to an improvement in camera apparatus used to produce apertures by exposing a pattern on a photosensitive surface to light.

BACKGROUND ART

Masters of different circular sizes are known in the prior art as is apparatus for exposing incrementally linearly variable lines on a photosensitive surface. U.S. Pat. No. 3,668,990 to L. P. Hayes, commonly assigned, is an example of such a device.

U.S. Pat. No. 3,695,154 to Webster relates to a photoexposure device for exposing lines on a photosensitive surface wherein the device has a rectangular aperture. The width of the light spot may be varied. A pair of blades sliding in perpendicular directions form a variable aperture to determine the size and shape of the light spot.

U.S. Pat. No. 3,688,655 to Klostermann et al relates to a method of, and an apparatus for, writing mask patterns on a photographic material by means of light. The boundaries of the slit through which the light passes control the length of the rectangular light spot.

DISCLOSURE OF THE INVENTION

The present invention teaches a method of, and an apparatus for exposing a photosensitive surface to circular and annular patterns of light during the manufacture of glass masters. A linear light source is provided and its length is selectively variable. Relative rotation occurs between the light and the photosensitive surface so that circular or annular patterns are exposed on the photosensitive surface.

BRIEF DESCRIPTION OF THE DRAWINGS

The above and other features and advantages will become apparent during the following more detailed description taken in conjunction with the accompanying drawing in which the same reference numerals are used throughout to designate the same parts and wherein.

BEST MODE FOR CARRYING OUT THE INVENTION

Figure 1:
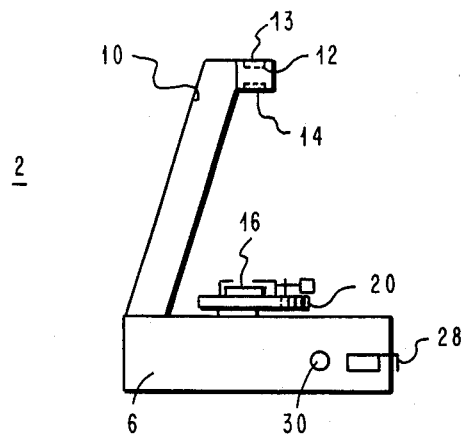
FIG. 1 is an overall schematic view of apparatus embodying the present invention.

Refer now to FIG. 1 which is a schematic illustration of a camera apparatus embodying the present invention. Camera 2 includes a base 6 and upwardly extending arm 10. At the top of arm 10 a holder 12 is provided for accepting an aperture blank 13 of photosensitive material. Beneath the holder 12 is a reducing, for example 10 to 1, lens 14 with a variable f-stop for focusing light on aperture blank 13. A light source 16 is provided on a rotating stage 20 mounted for rotation in base 6. Also shown in FIG. 1 schematically is a motor controller 28 and readout display 30.

Figure 2:
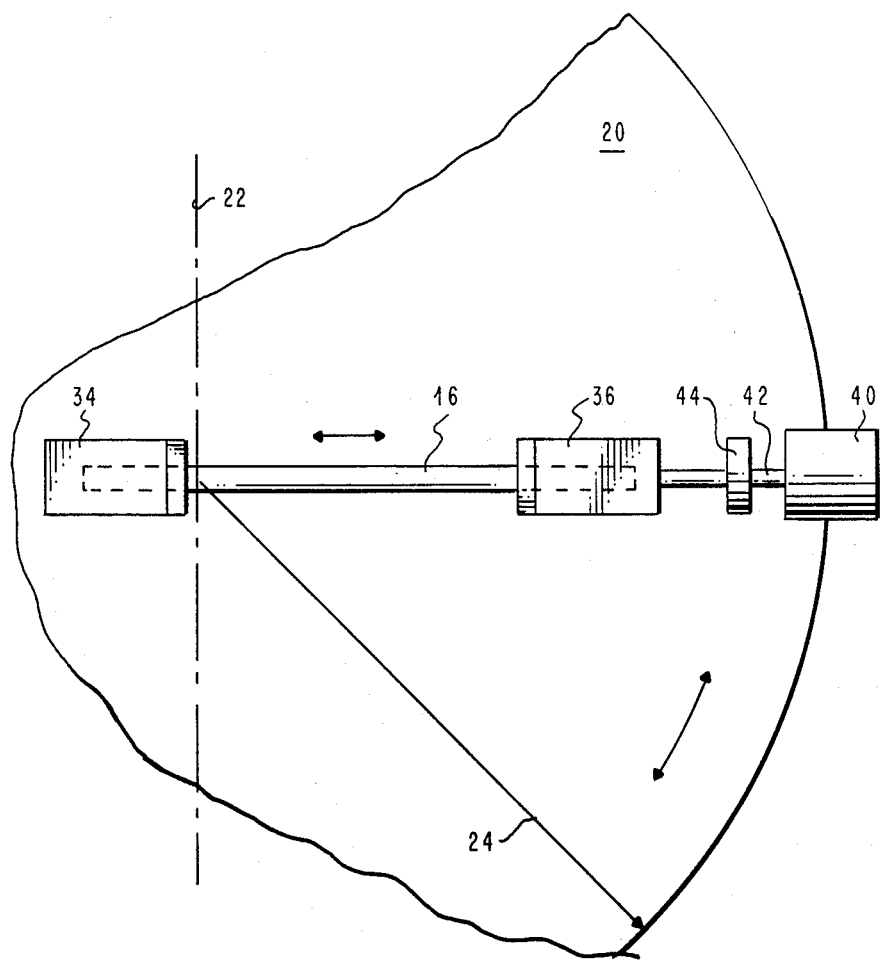
FIG. 2 is a partial, top view of the stage 20 shown in FIG. 1.

Refer now to FIG. 2 which is a partial top view of stage 20 and light source 16. Light source 16 may be a fluorescent lamp about six inches long. The axis of rotation of stage 20 is indicated at 22. Axis 22 coincides with the center of aperture blank holder 12. At one end of light source 16 is a fixed blade cover 34 mounted slightly, about 0.125 inch, off to the left of the axis of rotation 22. The radius of circular stage 20 is indicated at 24.

Blade cover 34 covers the end of lamp 16 and its electrodes and is positioned so that a small portion of the lamp length, about 0.125 inch, is visible to the left of the axis of rotation 22. The active area of lamp 16 extends through the axis of rotation 22 and radially extending along stage 20. A movable blade cover 36 is mounted to stage 20 at the other end of lamp 16. Adjustment knob 40 is fixedly connected by rod 42 to blade cover 36. A support 44 for adjustment rod 42 is mounted to stage 20. As will become more clear with reference to FIG. 3, adjustment knob 40 is used for radially positioning blade cover 36 along the length of light source 16.

Figure 3:
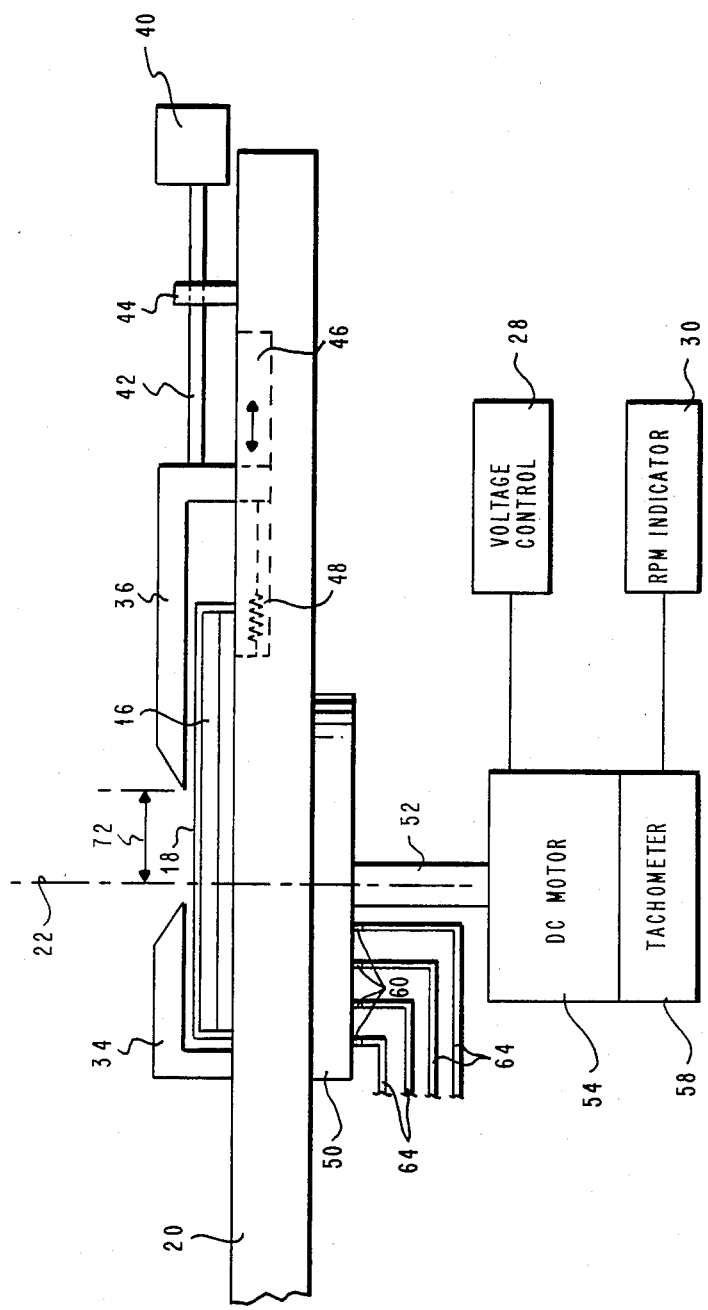
FIG. 3 is a cross section of the apparatus shown in FIG. 1 taken through the stage 20 and illustrating the motive means for the adjustable length light source 16.

Turning now to FIG. 3 a partial cross section of stage 20, a further description of the mechanism for providing variable length light sources will be given. Blade cover 36 is radially movable in stage 20. As can be seen in cross section, stage 20 is provided with a groove 46 in which the base of blade cover 36 may slide under bias from tension spring 48. Support 44 includes a detent means (not shown) for locking rod 42 in order to maintain blade 36 in a fixed position within groove 46.

Stage 20 is mounted to disk 50 which is connected to the output shaft 52 of a DC motor 54. A conventional voltage control means 28 is provided for regulating the speed of motor 54. Similarly, a conventional tachometer 58 and RPM gauge 30 are provided to facilitate operator readout. Contact rings 60 for power to lamp 16 are in wiping contact with wipers 64.

An optional diffuser 18 for lamp 16 is shown in FIG. 3. The length of the light available for focusing through lens 14 is between the axis of rotation 22 and end of movable cover blade 36 and is indicated by the arrow 72.

In operation the position of blade 36 determines the length of active area 72 of lamp 16. The distance between blades 34 and 36 determines the size of aperture master minus the offset between fixed cover blade 34 and the axis of rotation 22. When cover blade 36 is positioned to provide a desired light length 72 to be reduced through lens 14 and exposed on the aperture blank 13 in holder 12 (FIG. 1), stage 20 is rotated at a low rate, between 40 to 50 rpm. The linear expanse of light visible between blades 34 and 36 reduced through lens 14 corresponds to the radius of a circular light source. A circular pattern is thus exposed on an aperture blank 13 in holder 12. As stage 20 rotates, the small offset between the center of rotation 22 and cover blade 34 allows exposure of the center of the aperture blank in holder 12, and eliminates the possibility of dark spot formation.

The exposure characteristics of an aperture blank 13 are a function of time duration of exposure as well as light intensity. Exposure time and stage velocity vary in accordance with the nature of the lamp 16 and type of photographic emulsions used on the aperture blank.

The apparatus shown may be modified to provide a means for moving stationary cover blade 34 in a manner similar to that provided for cover blade 36. If cover blade 34 is movable to the right (as shown in FIG. 3) past the axis of rotation 22, then annular patterns will be exposed on aperture blank in holder 12. The active length 72 of light source 16 will be focused on the aperture blank as a section of a radius not reaching the center of the blank. Thus, rotation of stage 20 causes the aperture blank to "see" a ring of light.

While the invention has been shown and described with regard to a particular embodiment, the above modification and other changes in form and detail may be made without departing from the spirit and scope of the invention.

We claim:

1. A method of exposing variably sized circular apertures on a photo sensitive surface including the steps of:
   providing a variable length linear light source spaced away from the photosensitive surface; and
   simultaneously causing relative rotation about an axis of rotation passing through the center of the photosensitive surface and through the light source between the photosensitive surface and the light source.

2. A method of exposing variably sized annular apertures on a photosensitive surface including the steps of:
   providing a variable length linear light source spaced away from the photosensitive surface; and
   simultaneously causing relative rotation between the photosensitive surface and the light source about an axis of rotation passing through the center of the photosensitive surface and through a point radially offset from the light source.

3. Apparatus for exposing a photosensitive surface to light for forming round patterns of exposure characterized by:
   holder means for supporting the surface to be exposed;
   a linear light source with means for focusing light on said holder means; and
   motive means for causing simultaneously with light source operation relative rotational movement between said holder means and said light source about an axis of rotation passing through the center of said holder means.

4. The apparatus of claim 3 wherein the linear light source is variable in the length dimension.

5. The apparatus of claim 4 wherein the axis of rotation passes through the light source.

6. The apparatus of claim 4 wherein the axis of rotation passes through a point linearly offset from the light source.

7. The apparatus of claim 3 wherein the means for simultaneously causing relative rotational movement comprises:
   a rotating stage, supporting the linear light source, and operatively connected to the output shaft of a motor.

8. The apparatus of claim 7 wherein the linear light source comprises:
   a lamp;
   a first cover means for covering one end of the lamp and fixedly attached to said rotating support; and
   a second means for covering slidably mounted in said rotating support for covering incrementally varying linear portions of said lamp.

9. The apparatus of claim 7 wherein said means for focusing comprises a reducing lens interposed between said holder means and said linear light source.

10. The apparatus of claim 9 wherein said linear light source includes means for varying the length dimension of the light source comprising:
    a pair of incrementally adjustable cover means located on either end of said linear light source for uncovering incrementally variable portions of said light source.

* * * * *